United States Patent
Hanssen et al.

(10) Patent No.: US 9,696,353 B2
(45) Date of Patent: Jul. 4, 2017

(54) MEASURING POWER CONSUMPTION OF CIRCUIT COMPONENT OPERATING IN RUN MODE

(71) Applicant: Atmel Corporation, San Jose, CA (US)

(72) Inventors: Ingar Hanssen, Tiller (NO); Jo Inge Lamo, Tiller (NO)

(73) Assignee: Atmel Corporation, San Jose, CA (US)

( * ) Notice: Subject to any disclaimer, the term of this patent is extended or adjusted under 35 U.S.C. 154(b) by 363 days.

(21) Appl. No.: 13/953,140

(22) Filed: Jul. 29, 2013

(65) Prior Publication Data

US 2015/0028898 A1    Jan. 29, 2015

(51) Int. Cl.
*G01R 21/06* (2006.01)

(52) U.S. Cl.
CPC ................... *G01R 21/06* (2013.01)

(58) Field of Classification Search
CPC .... G01R 21/06; G01R 21/07; G01R 31/2874; G01R 31/2875; G01R 31/2877; G01R 31/26; G01R 31/2642; G01R 31/2648; G01R 31/2831; G01R 31/31702; G01R 33/0047; G01R 1/0491; G01R 31/265; G01R 31/3012; G01R 31/318511; H01L 2933/0033; H01L 33/48
USPC ............. 324/691, 705, 750.3, 762.01–762.1, 324/764.01
See application file for complete search history.

(56) References Cited

U.S. PATENT DOCUMENTS

| | | | | |
|---|---|---|---|---|
| 4,528,503 A * | 7/1985 | Cole | ................. | G01R 31/2603 136/290 |
| 6,268,710 B1 * | 7/2001 | Koga | ................. | G01R 31/3624 320/116 |
| 6,798,250 B1 * | 9/2004 | Wile | ................. | G01R 19/0092 327/51 |
| 2003/0206021 A1 * | 11/2003 | Laletin | ............... | G01R 31/3631 324/426 |
| 2004/0246031 A1 * | 12/2004 | Lourens | ................. | G01K 3/005 327/58 |
| 2005/0040810 A1 * | 2/2005 | Poirier | ............... | G01R 31/2884 716/106 |
| 2007/0080696 A1 * | 4/2007 | Kumar | ................... | G01R 27/00 324/691 |
| 2009/0097285 A1 | 4/2009 | Cook | | |
| 2010/0225492 A1 * | 9/2010 | Abdoulin | ............... | G01D 21/02 340/626 |

(Continued)

*Primary Examiner* — Tung X Nguyen
*Assistant Examiner* — Robert P Alejnikov, Jr.
(74) *Attorney, Agent, or Firm* — Fish & Richardson P.C.

(57) ABSTRACT

A sense resistor is coupled between a power source and one or more power pins of an integrated circuit (IC) chip including a circuit component (e.g., a microcontroller unit (MCU)). An on-chip amplifier (e.g., a programmable gain amplifier or op-amp) amplifies the voltage drop over the sense resistor to a level that is within the dynamic range of an on-chip analog-to-digital converter (ADC). In some implementations, the measured signals can be time-stamped and stored in a trace buffer and aligned with other trace data using a front-end tool (e.g., a personal computer). In some implementations, circuitry is included for detecting and handling power consumption events associated with the circuit component. In some implementations, a program counter associated with the circuit component is synchronously sampled with the power consumption measurements and/or other data sources.

20 Claims, 5 Drawing Sheets

(56) References Cited

U.S. PATENT DOCUMENTS

| | | |
|---|---|---|
| 2010/0250043 A1 | 9/2010 | Scheucher |
| 2010/0306737 A1* | 12/2010 | Hamilton, II ............. G06F 8/73 |
| | | 717/110 |
| 2011/0040515 A1* | 2/2011 | Miller .................... F41A 31/00 |
| | | 702/108 |
| 2011/0074382 A1* | 3/2011 | Patel .................... G01R 15/207 |
| | | 324/76.11 |
| 2011/0095728 A1 | 4/2011 | Chen |
| 2011/0187329 A1* | 8/2011 | Majima ................. G01R 31/36 |
| | | 320/149 |
| 2011/0204865 A1 | 8/2011 | Ye |
| 2012/0205258 A1* | 8/2012 | Noble .................... G01N 27/48 |
| | | 205/775 |
| 2014/0062940 A1 | 3/2014 | Al-Dahle |
| 2014/0132337 A1 | 5/2014 | Yannette |
| 2015/0028887 A1 | 1/2015 | Hanssen |

* cited by examiner

MEASURING POWER CONSUMPTION OF CIRCUIT COMPONENT OPERATING IN RUN MODE

TECHNICAL FIELD

This disclosure relates generally to obtaining measurement data from a circuit component included in an integrated circuit (IC) chip.

BACKGROUND

Consumers continue to demand more functionality and higher performance in their battery-operated products, such as smart phones and electronic tablet computers. To maximize functionality and battery life, developers of these battery-powered applications must consider several factors in their system design. In these applications, the microcontroller is a primary power consumer and developers must carefully consider the way energy is used. In some cases, developers may need to measure power consumption of the microcontroller while in run mode. Traditional solutions for measuring power consumption use external current measuring circuitry.

SUMMARY

A sense resistor is coupled between a power source and one or more power pins of an IC chip including a circuit component (e.g., a microcontroller unit (MCU)). An on-chip amplifier (e.g., a programmable gain amplifier or op-amp) amplifies the voltage drop over the sense resistor to a level that is within the dynamic range of an on-chip analog-to-digital converter (ADC). In some implementations, the measured signals can be time-stamped and stored in a trace buffer and aligned with other trace data using a front-end tool (e.g., a personal computer). In some implementations, circuitry is included for detecting and handling power consumption events associated with the circuit component. In some implementations, a program counter associated with the circuit component is synchronously sampled with the power consumption measurements and/or other data sources.

In some implementations, a method of obtaining measurement data from a circuit component included in an IC chip, comprises: measuring a voltage drop across a sense resistor coupled to a power terminal of the IC chip; amplifying the voltage drop using an on-chip amplifier; converting the amplified voltage drop to digital data using an on-chip analog-to-digital converter (ADC); determining a time of measurement; and storing the time and digital data.

In some implementations, a method of detecting and handling power consumption events associated with a circuit component included in an IC chip, comprises: measuring a voltage drop across a sense resistor coupled to a power terminal of the IC chip; amplifying the voltage drop using an on-chip amplifier; comparing the amplified voltage drop to voltage references defining limits for over current or under current conditions; and determining a power event based on results of the comparing.

Other implementations are directed to circuits and systems.

Particular implementations disclosed herein provide one or more of the following advantages: 1) battery lifetime calculations can be made on real-time measurements that take into account battery chemistry; 2) power consumption monitoring can be built into the component with only an external sense resistor; 3) the sense resistor can also serve as a first order low-pass filter for filtering high-frequency noise; 4) power measurements can be triggered upon current consumption events; and 5) a program counter sampler can be synchronized with power consumption measurements and/or other data sources.

DETAILED DESCRIPTION

Figure 1:
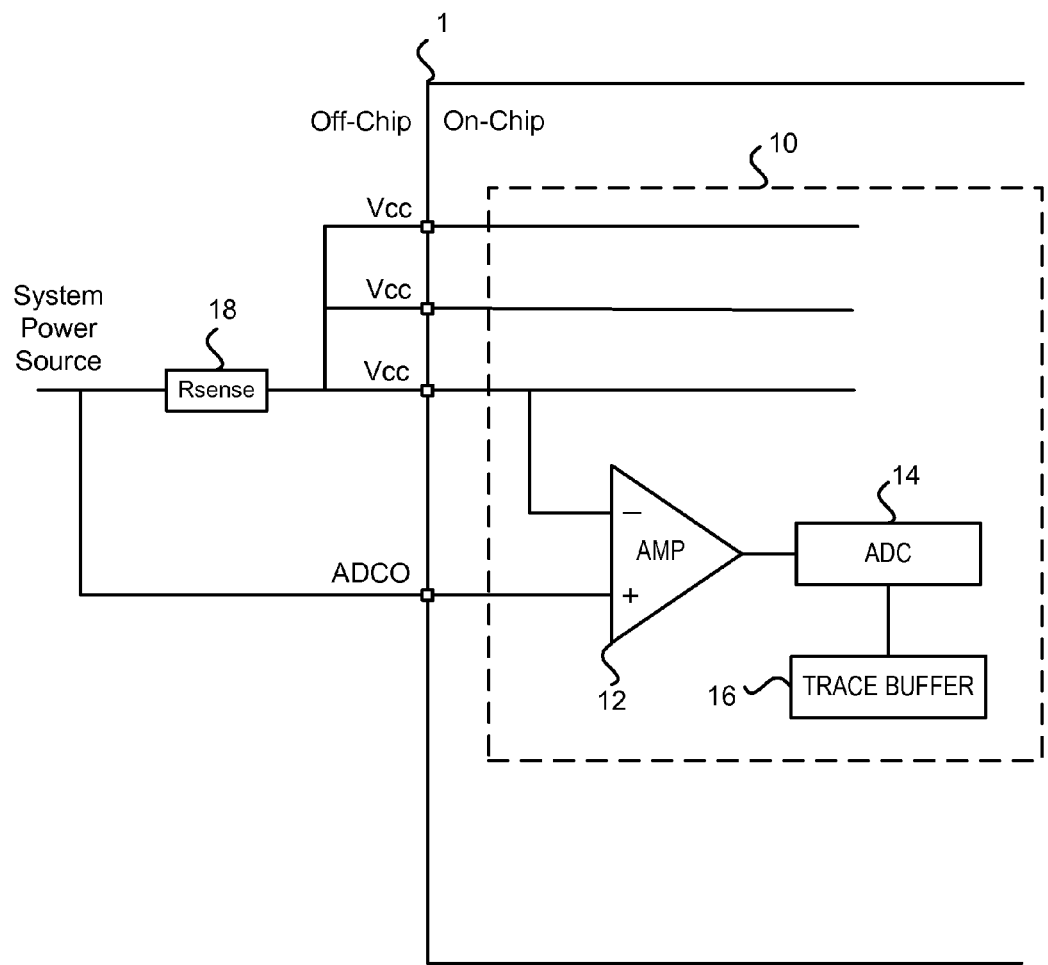
FIG. 1 is a circuit diagram of an example circuit for measuring power consumption of a circuit component.

FIG. 1 is a circuit diagram of an example measuring circuit 10 for measuring power consumption of a circuit component. Circuit 10 can be included in IC chip 1 that also includes the circuit component for which power consumption is to be measured. In some implementations, measuring circuit 10 can include discrete components. In some implementations, sense resistor 18 can be included in IC chip 1 or added as a part of a multi-die system-on-chip (SoC) solution.

In the example shown, the circuit component is a microcontroller unit (MCU). In some implementations, circuit 10 includes amplifier 12, ADC 14 and trace buffer 16. The output of sense resistor 18 is coupled to one or more power pins of the IC chip 1. A system power source (Vcc) is coupled to the input of sense resistor 18 and the positive terminal of amplifier 12 through another pin of the IC chip 1 (ADC0). Amplifier 12 can be an on-chip operational amplifier or a programmable gain amplifier (PGA).

By using on-chip resources (amplifier 12, ADC 14), the MCU can measure its own power consumption. Amplifier 12 amplifies the voltage drop over sense resistor 18 to a level where it can utilize the dynamic range of ADC 14. A set of gain settings can be built into the amplification stage. Each of the settings can be calibrated against a zero point by shorting the inputs of amplifier 12.

In some implementations, a simple calibration current generator (not shown) can be implemented for calibrating the gain settings. For example, by adding a fixed amount of current (e.g., 5 mA), two points on a linear curve can be measured and from these measurements the coefficients A, B in the linear equation $y=Ax+B$ can be calculated, where y is the current consumption and x is the sampled voltage drop, B is an offset correction and A is a gain factor. Some example calculations are as follows.

Given Rsense=2.2R, Gain=100, Vcc=3.3V, ADC full-scale for Icc=15 mA, 12-bit ADC resolution 3.66 µA/count, the voltage drop over Rsense=33 mV at 15 mA.

Given Rsense=1R, Gain=10, Vcc=1.8V, ADC full-scale for Icc=180 mA, 12-bit ADC resolution 43.9 µA/count, the voltage drop over Rsense=100 mV at 100 mA.

Given Rsense=3.3R, Gain=200, Vcc=1.8V, ADC full-scale for Icc=2.72 mA, 12-bit ADC resolution 0.66 μA/count, the voltage drop over Rsense=9 mV at 2 mA.

The power consumption measurements can be time-stamped and stored in trace buffer 16. A front-end tool (e.g., a personal computer) running a power analysis application can access the measurements and align the measurements with other trace data (e.g., instruction trace, interrupt trace, DMA trace or events). The front-end tool can use the measurements to identify a power profile for the running code, and when combined with an ultra-low power sleep-mode power measurement circuit, a total power profile can be built for the circuit component. The power profile can be used in battery lifetime calculations that take into account battery chemistry.

Figure 2:
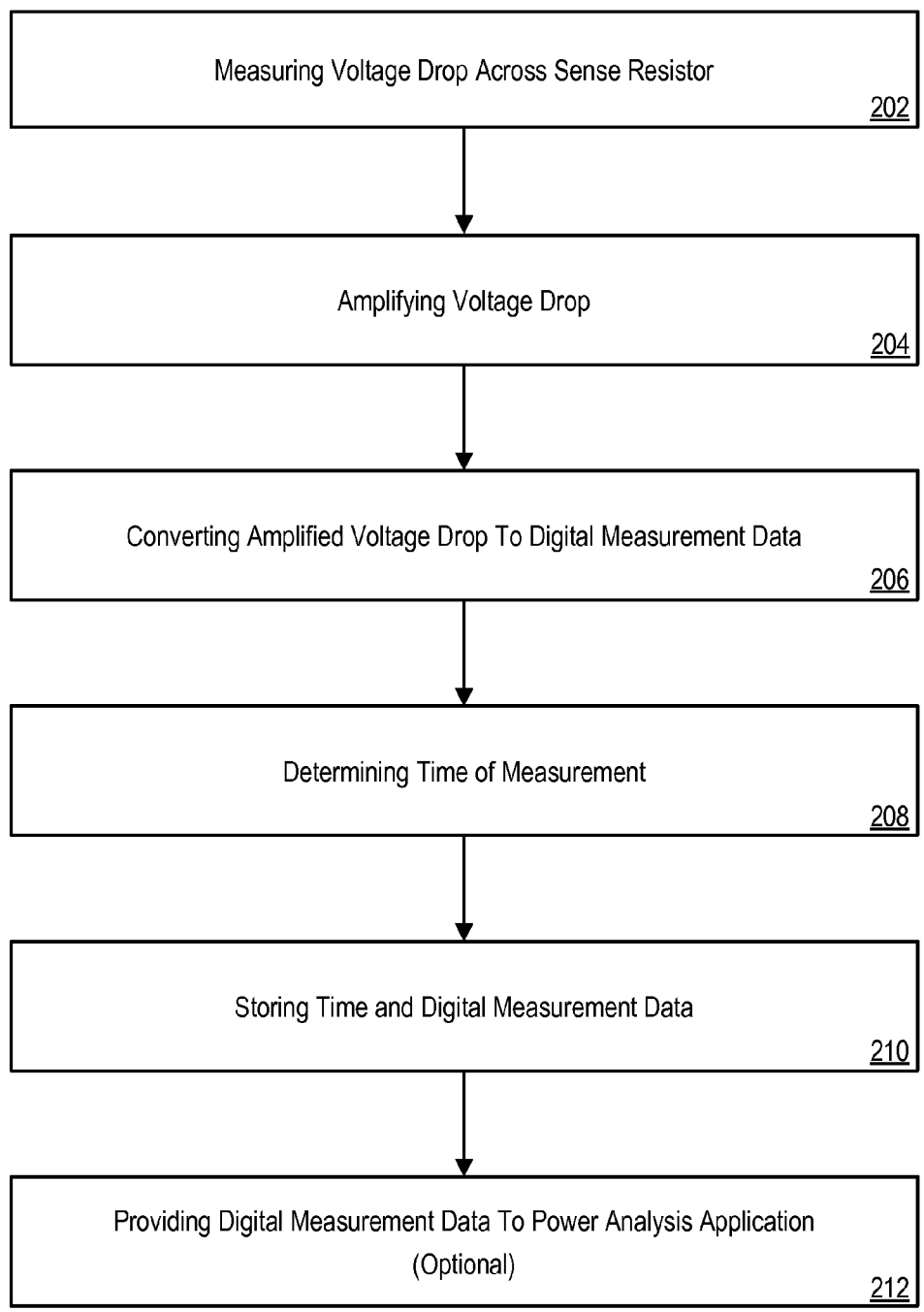
FIG. 2 is a flow diagram illustrating an example process of measuring power consumption using the measuring circuit of FIG. 1.

FIG. 2 is a flow diagram illustrating an example process 200 of measuring power consumption of the circuit component of FIG. 1. Process 200 can be implemented using measuring circuit 10 shown in FIG. 1.

In some implementations, process 200 includes the steps of: measuring a voltage drop across a sense resistor (202); amplifying the voltage drop (204); converting the amplified voltage drop to digital data (206); determining a time of measurement (208); storing the time and digital data (210); and providing the digital data to a power analysis application (212).

The sense resistor can be external or internal to the IC chip or added as a part of a multi-die SoC solution. The amplification and conversion of the voltage drop across the sense resistor can be performed by on-chip hardware, such as PGA (or op-amp) and ADC. The time of measurement or timestamp can be determined by an on-chip clock source. The power analysis application can include instructions that run on a personal computer or other computing device that is coupled to the IC chip. The application can be configured to access digital data from a trace buffer or other on-chip or off-chip data store.

Figure 3:
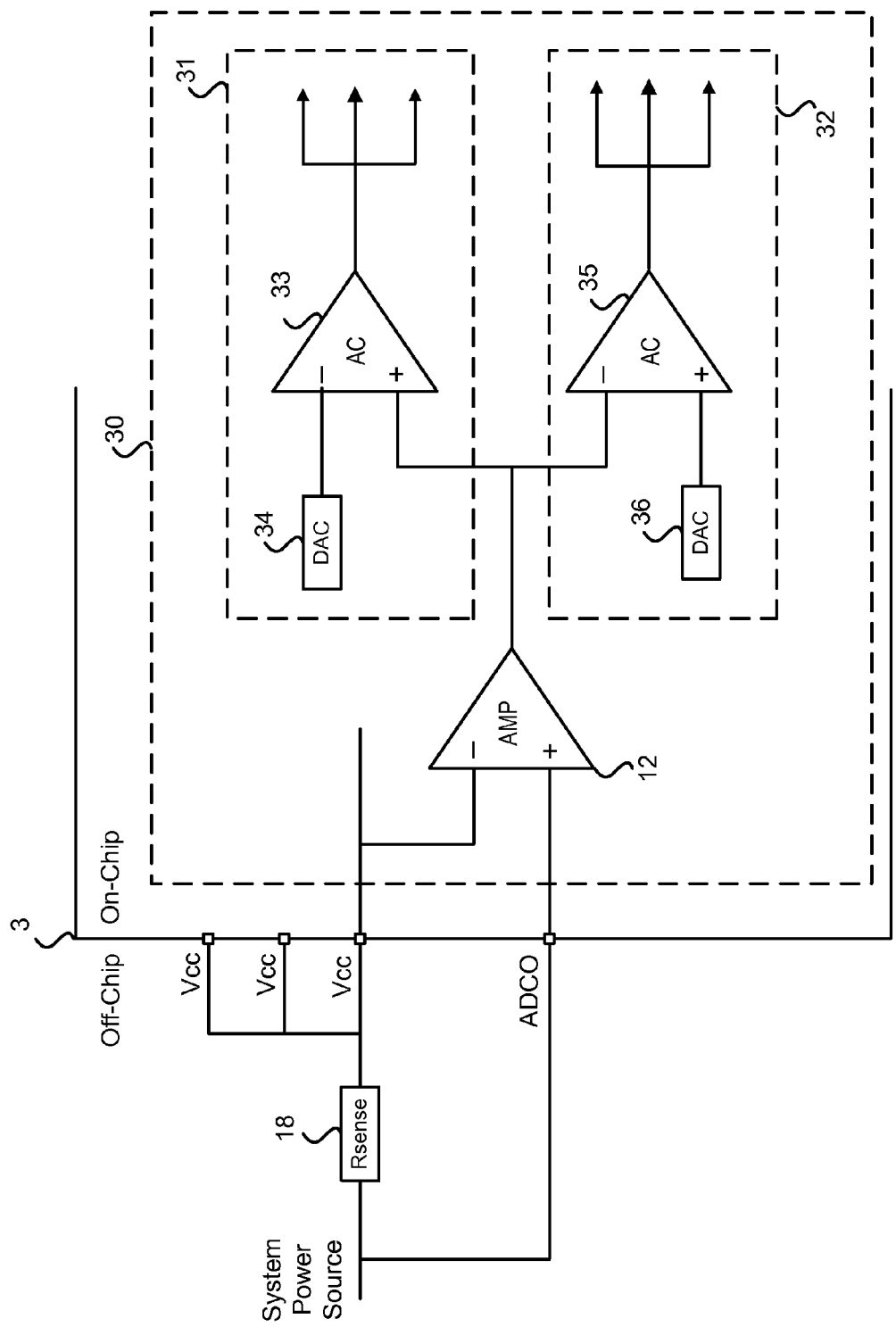
FIG. 3 is a circuit diagram of an example circuit for measuring power consumption of a circuit component that is capable of detecting and handling power consumption events.

FIG. 3 is a circuit diagram of an example measuring circuit 30 for measuring power consumption of a circuit component (e.g., an MCU) included in an IC chip 3 that is capable of detecting and handling consumption events. Circuit 30 includes amplifier 12, and may include at least one of high-current event detector 31 and low-current event detector 32. High-current event detector 31 includes analog comparator 33 and optional digital-to-analog converter (DAC) 34. Low-current event detector 31 includes analog comparator 33 and optional DAC 34. Circuit 30 can be included in IC chip 3.

Circuit 30 uses on-chip hardware to detect current consumption events (e.g., over and under current events). In many applications, the power consumption of the circuit component has to stay within given limits. This requirement is due to a battery's maximum current limit (e.g., silver oxide batteries) or a power supply's minimum load to be stable. During development, it can be important to verify that the current consumption stays within these limits. For example, in a debug session, one might want to break program execution in response to excessive power levels to identify the reason. In a running system, one might want to enter a special handler for current consumption events (e.g., an exception handler). The latter scenario could occur with safety systems where monitoring the system is monitored to ensure the system operates within safe power consumption limits.

Referring now to FIG. 3, circuit 30 measures current flow into the circuit component by measuring the voltage drop over sense resistor 18 (e.g., 1 ohm range) and amplifying this voltage drop using amplifier 12, which can be an on-chip op-amp or a PGA. The resulting output signal from amplifier 12 is fed to high-current and low-current detectors 31, 32. More particularly, the output of amplifier 12 is fed into the positive terminal of comparator 33 and the negative terminal of comparator 35. The negative terminal of comparator 33 is coupled to a first voltage reference. The positive terminal of comparator 35 is coupled to a second voltage reference. The voltage references can be variable or constant.

In the example shown, the first voltage reference is provided by DAC 34 and the second voltage reference is provided by DAC 36. The voltage references can also be fed into circuit 30 by external or off-chip circuitry. The first and second voltage references define the trigger levels of comparators 33, 35. When measured current passes one of the limits defined by the first or second voltage references, the output of comparator 33 or 35 will toggle. The output signals of comparators 33, 35 can be coupled to an event system, an exception/interrupt system and/or an on-chip debug system (OCD).

Using the comparator-based solution of circuit 30, the detection and handling of power consumption events in the circuit component can be implemented without the use of an amp meter, external circuit loggers or oscilloscope measurements. The comparator-based solution has less delay than an ADC-based solution. A comparator will trigger more or less immediately in response to a power event while the ADC will have to complete an ADC conversion before data can be analyzed and a high/low current event can be detected.

Figure 4:
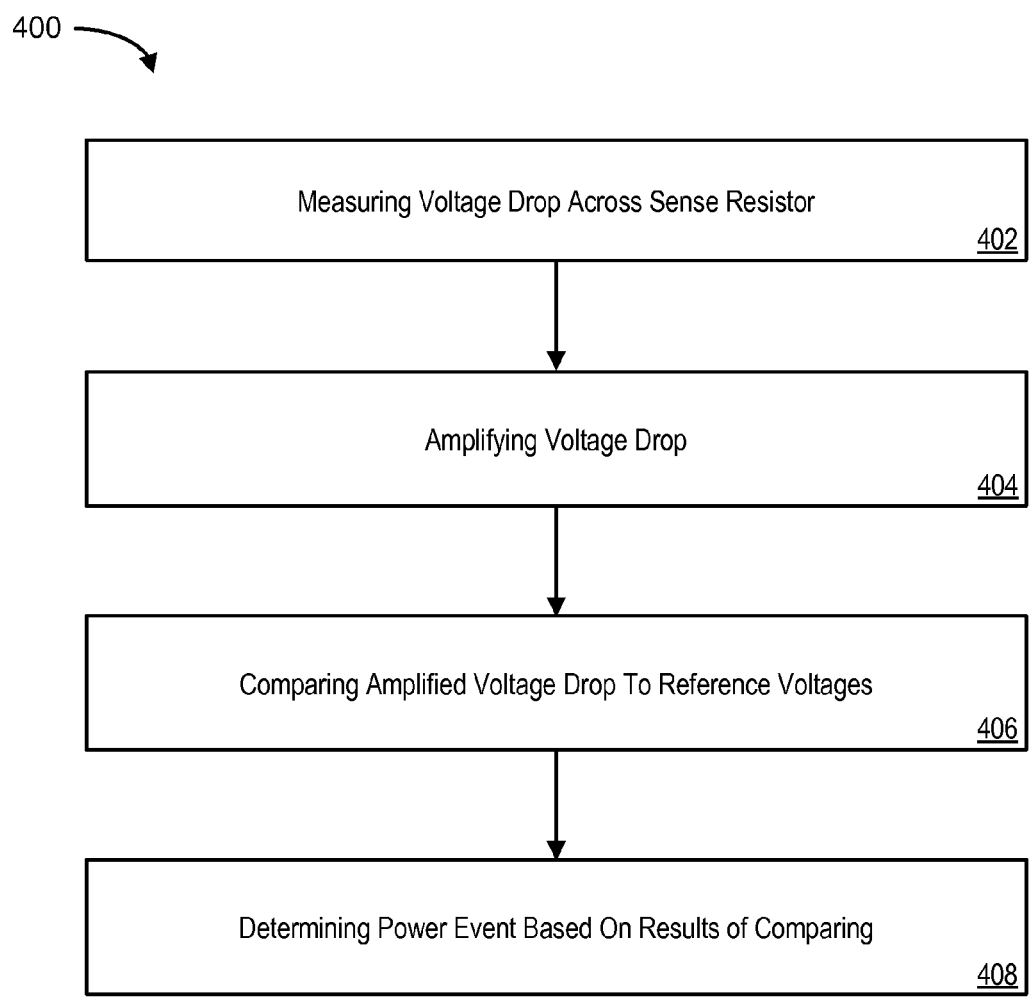
FIG. 4 is a flow diagram illustrating an example process of detecting and handling power consumption events using the circuit of FIG. 3.

FIG. 4 is a flow diagram illustrating an example process 400 of detecting and handling power consumption events using circuit 30 of FIG. 3.

In some implementations, process 400 includes the steps of: measuring a voltage drop across a sense resistor (402); amplifying the voltage drop (404); comparing the amplified voltage drop to one or more reference voltages (406); and determining a power event based on the results of the comparing (408). In some implementations, the circuit shown in FIG. 1 can co-exist with the circuits shown in FIGS. 3 and 5 in the same device sharing resistor 18 and amplifier 12.

The sense resistor can be external to the IC chip (off-chip) or on-chip. The amplification of the voltage drop across the sense resistor can be performed by on-chip hardware (e.g., PGA, op-amp). The voltage references can be programmed digital values that are converted to analog voltages by optional DACs 34, 36. The output trigger signals of comparators 33, 35 can be coupled to an event system, an exception/interrupt system and/or an OCD for handling power consumption events. In some implementations, one of comparators 33 or 35, or three or more comparators, may be used depending on the type and number of power events to be detected.

Figure 5:
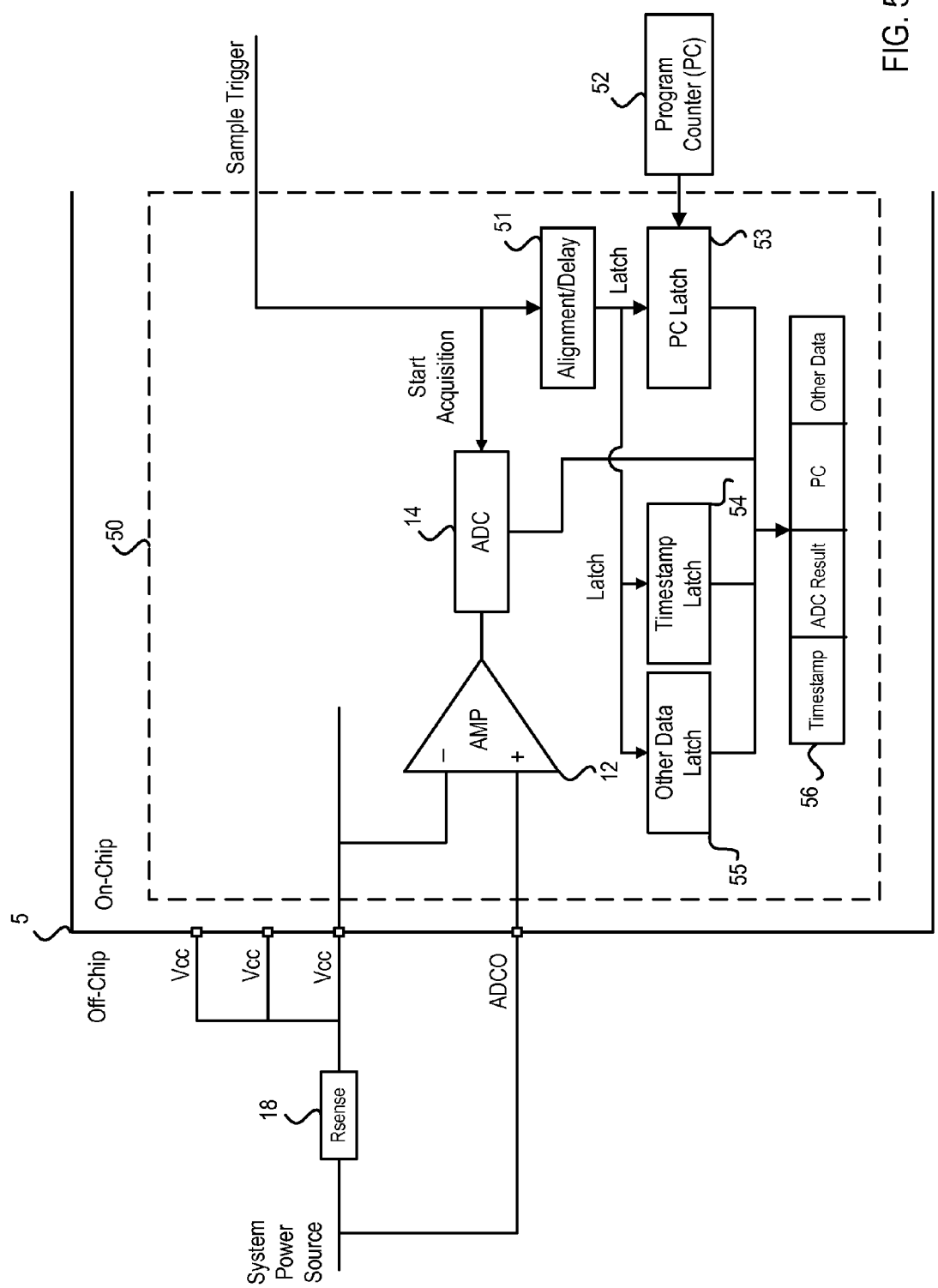
FIG. 5 is a circuit diagram of an example circuit for synchronizing the sampling of a program counter with power consumption measurements.

FIG. 5 is a circuit diagram of an example measuring circuit 50 for synchronizing the sampling of a program counter (PC) of the circuit component with power consumption measurements. Synchronizing the sampling of a PC with power consumption measurements associates the power consumption measurements with a location in the user's program, which in turn can be used to identify the source code lines associated with the individual power measurements.

Circuit 50 can be included in IC chip 5. In some implementations, circuit 50 can include amplifier 12, ADC 14, alignment delay 51, latches 54-55 and buffer 56. Circuit 50 is coupled to sense resistor 18 and PC 52. PC 52 is coupled to PC latch 53 for latching PC data. In some implementations, amplifier 12 is a PGA and can be off-chip.

Circuit 50 enables synchronized sampling of a PC with a measurement of power consumption and/or other data sources (e.g., event system) in a circuit component, such as an MCU or MCU system. The power measurements can be obtained using an on-chip ADC 14. Off-chip hardware can also be used but may require the use of a synchronization mechanism using additional IC pins (e.g., additional GPIO).

The PC sampling can be synchronized with the actual ADC start acquisition (sample-and-hold) to align the power measurements. A typical sample-and-hold time for a low/mid-end MCU ADC is in the range of 0.25-1 microseconds. For a 20 MHz MCU system with a 0.5 microsecond sample-and-hold time, the power consumption measurement can be measured down to a +/−5 instructions precision without the addition of hardware (1 instruction takes typically 0.05 microseconds to execute at 20 MHz). Without synchronization, the alignment of PC samples and power measurements may have to be done using timestamps from a common global timestamp source and alignment of data will have to be done in a post processor which may be on-chip in the form of a program or in an off-chip tool.

Once the measurement is converted to digital data by ADC 14, data record 56 for the power measurement sample (e.g., power trace record) can be assembled to contain the digital data, including but not limited to a timestamp for the measurement, a PC sample, the ADC conversion result and other data from the system, such as the state of an event system or the values on a general purpose input/output (GPIO) port input, etc. Data record 56 can be stored in trace buffer, system memory or any other suitable data store. Data record 56 can be communicated to other systems over a low bandwidth serial trace port, over a high-speed parallel port or in response to polling. Outputting data to a dedicated trace buffer or even to a system memory using direct memory access (DMA) is also possible.

Similar mechanisms of synchronization can also be used to trigger power measurements initiated by other events in the circuit component, such as event systems, DMA transfers and others. For example, a sample trigger can be used to start ADC acquisition. The sample trigger can be provided by a debug system, ADC done signal (free running), an event system, trigger points or any other sample trigger.

While this document contains many specific implementation details, these should not be construed as limitations on the scope what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can, in some cases, be excised from the combination, and the claimed combination may be directed to a sub combination or variation of a sub combination.

What is claimed is:

1. A method of measuring power consumption of an integrated circuit (IC) chip, the method comprising:
    measuring a voltage drop across a resistor coupled to a power terminal of the IC chip located outside the IC chip and a system power source terminal located outside the IC chip, the power terminal for providing power from the system power source to components in the IC chip;
    amplifying the voltage drop using an on-chip amplifier, the on-chip amplifier including a first input coupled to the power terminal and a second input coupled to the system power source terminal;
    converting the amplified voltage drop to digital data using an on-chip analog-to-digital converter (ADC);
    determining a time of measurement; and
    storing the time of measurement and digital data.

2. The method of claim 1, further comprising:
    providing a power analysis application access to the stored digital data.

3. The method of claim 1, where the on-chip amplifier is a programmable gain amplifier (PGA).

4. The method of claim 3, where the PGA is programmed to provide a voltage level that is within the dynamic range of the ADC.

5. The method of claim 4, where the PGA is programmed with gain settings that were calibrated against a zero point.

6. The method of claim 1, where the IC chip is a microcontroller unit (MCU).

7. The method of claim 1, further comprising:
    adding a fixed amount of current to the power terminal;
    measuring the voltage drop across the resistor;
    calculating coefficients of a formula; and
    calculating power consumption of the IC chip using the formula.

8. The method of claim 7, where the formula is $y=Ax+B$, where x is the voltage drop, y is the current consumption, B is an offset correction and A is a gain factor.

9. The method of claim 1, further comprising:
    sampling a program counter; and
    synchronizing the sampled program counter with the digital data.

10. An integrated circuit (IC) chip comprising:
    an amplifier, included in the IC chip, and configured for amplifying a voltage drop across a sense resistor coupled to a power terminal of the IC chip located outside the IC chip and a system power source terminal located outside the IC chip, the on-chip amplifier including a first input coupled to the power terminal and a second input coupled to the system power source terminal, the power terminal for providing power from the system power source to one or more components in the IC chip;
    an analog-to-digital converter (ADC), in the IC chip, and configured for converting the amplified voltage drop to digital data; and
    a trace buffer coupled to the ADC and configured for storing the digital data.

11. The circuit of claim 10, further comprising:
    a power analysis tool coupled to the IC chip and configured to run a power analysis application that accesses the stored digital data.

12. The circuit of claim 10, where the amplifier is a programmable gain amplifier (PGA).

13. The circuit of claim 12, where the PGA is programmed to provide voltage levels within the dynamic range of the ADC.

14. The circuit of claim 13, where the PGA is programmed with gain settings that were calibrated against a zero point.

15. The circuit of claim 10, where the IC chip is a microcontroller unit (MCU).

16. The circuit of claim 10, further comprising:
a current generator configured for adding a fixed amount of current to the power terminal.

17. The circuit of claim 10, further comprising:
a program counter (PC) inside the IC chip; and
PC sampler configured for sampling the PC and synchronizing the sampled PC with the digital data.

18. An integrated circuit (IC) chip comprising:
an amplifier having a first input coupled to a power terminal of the IC chip for powering components of the IC chip, and a second input coupled a system power source terminal, the amplifier configured for amplifying a voltage drop across the power terminal and the system power source terminal;
an analog-to-digital converter (ADC), in the IC chip, and configured for converting the amplified voltage drop to digital data in response to a trigger signal;
a program counter (PC) operable to indicate a current location in a software program;
a delay circuit responsive to the trigger signal, the delay circuit configured to generate a latch signal by adjusting the trigger signal according to an ADC conversion time; and
a PC latch circuit coupled to the delay circuit, the PC latch circuit configured to sample the PC counter in response to the latch signal.

19. The circuit of claim 18, further comprising:
a time latch circuit coupled to the delay circuit, the time latch circuit configured to sample a measurement time.

20. The circuit of claim 19, further comprising:
a trace buffer coupled to the ADC, the PC latch circuit and the time latch circuit, the trace buffer configured to store the sampled measurement time, the sampled PC and the digital data.

* * * * *

UNITED STATES PATENT AND TRADEMARK OFFICE
CERTIFICATE OF CORRECTION

| | |
|---|---|
| PATENT NO. | : 9,696,353 B2 |
| APPLICATION NO. | : 13/953140 |
| DATED | : July 4, 2017 |
| INVENTOR(S) | : Ingar Hanssen and Jo Inge Lamo |

It is certified that error appears in the above-identified patent and that said Letters Patent is hereby corrected as shown below:

In the Claims

Column 6, Line 9, Claim 1 delete "-to -" and insert -- -to- --, therefor.

Column 7, Line 12, Claim 18 after "coupled" insert -- to --.

Signed and Sealed this
Fifth Day of September, 2017

Joseph Matal
*Performing the Functions and Duties of the*
*Under Secretary of Commerce for Intellectual Property and*
*Director of the United States Patent and Trademark Office*